US010586592B1

(12) United States Patent
McGlaughlin et al.

(10) Patent No.: US 10,586,592 B1
(45) Date of Patent: Mar. 10, 2020

(54) DISTURB MANAGEMENT BASED ON WRITE TIMES

(71) Applicant: Micron Technology, Inc., Boise, ID (US)

(72) Inventors: Edward C. McGlaughlin, Minneapolis, MN (US); Samuel E. Bradshaw, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/110,758

(22) Filed: Aug. 23, 2018

(51) Int. Cl.
*G06F 3/00* (2006.01)
*G11C 13/00* (2006.01)
*G06F 3/06* (2006.01)

(52) U.S. Cl.
CPC ........ *G11C 13/0033* (2013.01); *G06F 3/0619* (2013.01); *G06F 3/0659* (2013.01); *G06F 3/0673* (2013.01); *G11C 13/003* (2013.01); *G11C 13/0004* (2013.01); *G11C 13/0061* (2013.01); *G11C 13/0069* (2013.01)

(58) Field of Classification Search
CPC .......................... G11C 13/0033; G06F 3/0673
USPC ....................................................... 711/105
See application file for complete search history.

(56) References Cited

U.S. PATENT DOCUMENTS

| 4,266,286 | A * | 5/1981 | Richard .............. G11C 11/4096 327/51 |
| 8,861,109 | B1 * | 10/2014 | Hwang ............ G11B 20/10305 360/31 |
| 9,202,547 | B2 | 12/2015 | Damle et al. |
| 10,032,500 | B2 | 7/2018 | Ong et al. |
| 2009/0109755 | A1 * | 4/2009 | Edan .................. G11C 16/0475 365/185.11 |
| 2015/0193302 | A1 | 7/2015 | Hyun et al. |
| 2017/0263305 | A1 | 9/2017 | Cho et al. |
| 2018/0024777 | A1 | 1/2018 | Higgins et al. |
| 2018/0067850 | A1 | 3/2018 | Kawamura et al. |

FOREIGN PATENT DOCUMENTS

CN           107039059 A      8/2017

OTHER PUBLICATIONS

International Search Report and Written Opinion from related international application No. PCT/US2019/047460, dated Dec. 10, 2019, 12 pages.

* cited by examiner

*Primary Examiner* — Jae U Yu
(74) *Attorney, Agent, or Firm* — Brooks, Cameron & Huebsch, PLLC

(57) ABSTRACT

An example method includes determining a time between writes in place to a particular memory cell, incrementing a disturb count corresponding to a neighboring memory cell by a particular count increment that is based on the time between the writes to the particular memory cell, and determining whether to check a write disturb status of the neighboring memory cell based on the incremented disturb count.

20 Claims, 7 Drawing Sheets

DISTURB MANAGEMENT BASED ON WRITE TIMES

TECHNICAL FIELD

The present disclosure relates generally to memory and methods, and more particularly, to disturb management based on write times.

BACKGROUND

A memory sub-system can be a storage system, such as a solid-state drive (SSD), and can include one or more memory components that store data. The memory components can be, for example, non-volatile memory components and/or volatile memory components. In general, a host system can utilize a memory sub-system to store data at the memory components and to retrieve data from the memory components.

DETAILED DESCRIPTION

Figure 1:
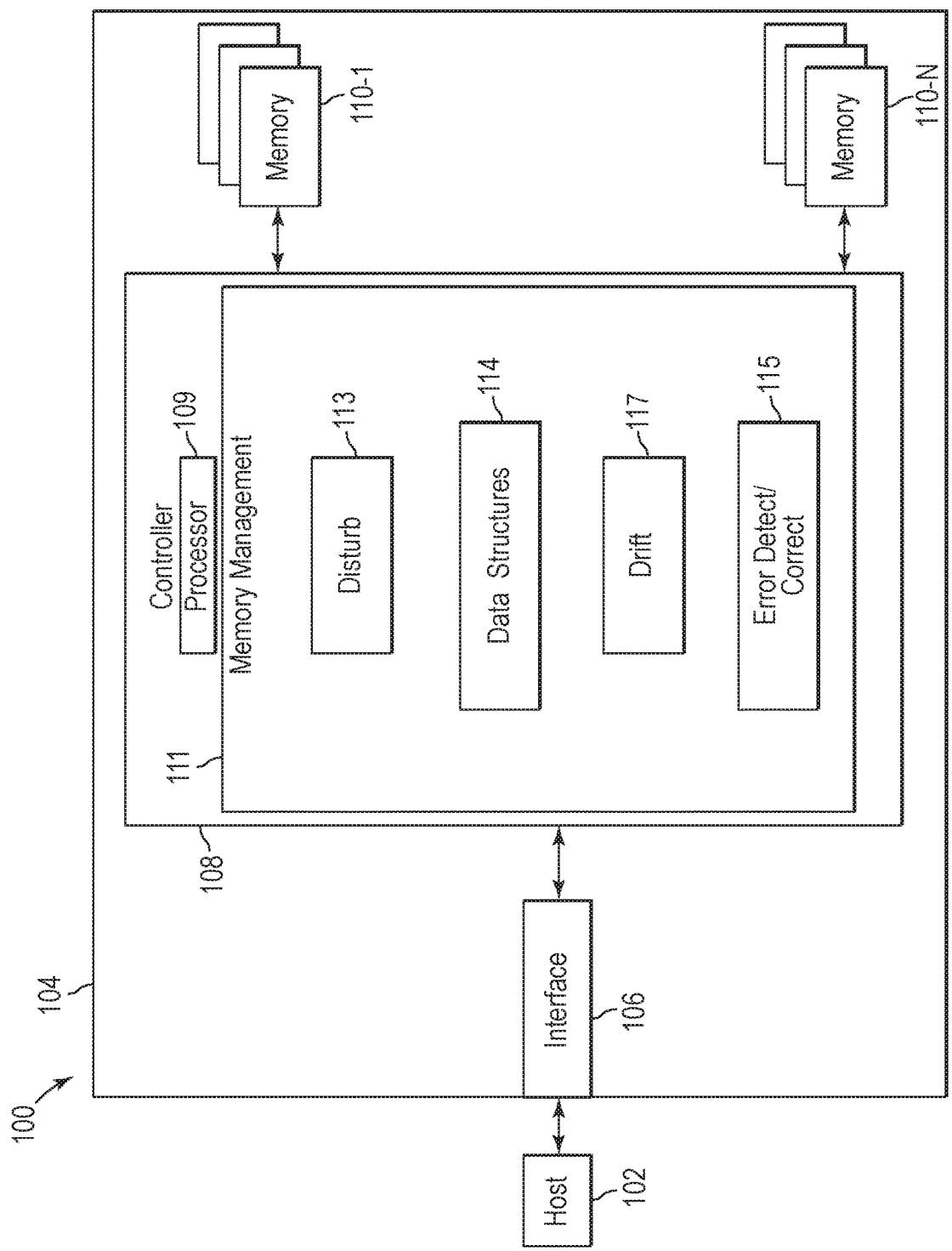
FIG. 1 illustrates a block diagram of an apparatus in the form of a computing system configured to perform disturb management in accordance with a number of embodiments of the present disclosure.

Aspects of the present disclosure are directed to write disturb management in a memory sub-system. An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Various embodiments provide technological improvements, such as improved handling of neighbor disturb as compared to prior approaches. For example, various embodiments provide for a more accurate determination of the thermal write disturb to resistance variable memory cells (e.g., victims) that are neighbors to resistance variable memory cells (e.g., aggressors) being written by basing the determination on a time between (e.g., a frequency of) writes to the aggressor. This allows for a more accurate determination of when to refresh the victims to correct for the thermal disturb compared to prior approaches.

For example, a write disturb count corresponding to a victim can be incremented by a count increment that is based on the time between the writes in place to the aggressor. A refresh operation can be performed on the victim responsive to the disturb count reaching a threshold count.

The respective states (e.g., stored data values) of resistance variable memory cells can depend on the respective programmed resistances of the memory cells corresponding to respective threshold voltages (Vts) of the cells. Resistive variable memory cells can be rewritten by overwriting them without first erasing them, in some examples. This can be referred to as writing in place. The state of a resistance variable memory cell can be determined (e.g., read), for example, by sensing current through the cell responsive to an applied sensing (e.g., a read) voltage.

As aggressor resistance variable cells are written in place, the temperatures of the aggressor cells can increase, especially when the aggressor cells are written repeatedly within a short period of time, such as within about 10 to 20 milliseconds. As the temperatures of the aggressor cells increase, more heat is transferred to the victim cells, causing the temperatures of the victim cells to increase. The amount by which the temperatures of the victim cells increase can depend on the time between writes to the aggressor cells. For example, the shorter the time between writes to the aggressor cells, the greater the temperature increase of the victim cells.

The increased temperatures can cause the programmed resistances of the victim cells to change, making it difficult to read the victim cells with a predetermined read voltage. This can be referred to as thermal write disturb. For example, the amount of thermal write disturb to the victim cells can depend on the time between writes to the aggressor cells. The victim cells can be refreshed by rewriting the victim cells back to their correct programmed resistive states.

A disturb counter can be used to keep track of the disturb to victim cells. If the disturb count is greater than a threshold value, the victim cells can be refreshed. In prior approaches, the counter can be incremented by increments that might not depend upon the time between writes (e.g., consecutive writes) to the aggressor cells and thus might not accurately account for thermal disturb. For example, in prior approaches, the counter can be incremented at the same rate for all victim cells. However, this can result in the victim cells being refreshed too infrequently in situations in which the aggressors experience relatively frequent writes within a relatively short time interval. For example, frequent writes to aggressors within a short time interval can result in greater disturb to victims than the disturb to victims caused by a same quantity of writes to the aggressors over a longer period. In such instances, the victims having experienced greater disturb are more prone to experiencing read errors despite having experiences a same quantity of disturb events due to writes to aggressors.

Incrementing the disturb count by a disturb count increment based on the time between writes can be used to account for the amount of thermal disturb to the victims. For example, the disturb count can be accelerated for short times between writes (e.g., greater thermal disturbs) compared to disturb counts for longer times between writes (e.g., lesser thermal disturbs). This can provide the ability to refresh the victims at more suitable times (e.g., before the victims are disturbed to a point where they store erroneous data values).

FIG. 1 illustrates a block diagram of an apparatus in the form of a computing system 100 configured to perform disturb management, in accordance with a number of embodiments of the present disclosure. As used herein, an "apparatus" can refer to, but is not limited to, a variety of structures or combinations of structures. For instance, memory system 104, controller 108, and memory components 110-1 to 110-N, might separately be considered an "apparatus."

The memory system 104 can be, for example, a storage system such as a solid state drive (SSD), embedded Multi-Media Controller (eMMC) device, Universal Flash Storage (UFS) device, and the like, and can include an interface 106, a controller 108, and a number of memory components 110-1 to 110-N, which may be referred to collectively as memory 110. The memory components 110 can provide a storage volume for the memory system 104; however, one or more of the memory components 110 may function as main memory for system 100. In a number of embodiments, the memory system 104 is a memory sub-system, a hybrid memory/storage system or the like.

As illustrated in FIG. 1, memory system 104 can be coupled to a host 102 via interface 106. Host 102 can be a host system, such as a personal laptop computer, a desktop computer, a digital camera, a mobile device (e.g., cellular phone), network server, Internet of Things (IoT) enabled device, or a memory card reader, among various other types of hosts. Host 102 can include a number of memory access devices (e.g., a number of processors) capable of accessing memory components 110 (e.g., via controller 108).

In the example illustrated in FIG. 1, the controller 108 is coupled to the memory components 110 via multiple channels and can be used to transfer data between the memory system 104 and host 102 (e.g., via interface 106). The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

The controller 108 can communicate with the memory components 110 to control data read, write, and erase operations, among other operations. Although not specifically illustrated, in some embodiments, the controller 108 can include a discrete memory channel controller for each channel coupling the controller 108 to the memory components 110. The controller 108 can include, for example, a number of components in the form of hardware (e.g., one or more integrated circuits) and/or software (e.g., instructions, which may be in the form of firmware) for controlling access to the number of memory components 110 and/or for facilitating data transfer between the host 102 and memory components 110. In general, the controller 108 can receive commands (e.g., operations) from the host 102 and can convert the commands into instructions or appropriate commands to achieve the desired access to the memory components 110.

As described further herein, the controller 108 can be responsible for, among other operations, memory management operations, such as disturb management (e.g., mitigation) operations, drift management operations, error detection and/or correction operations, and address translation operations, among various other operations associated with the memory components 110. The controller can perform memory management in association with performing background operations and/or foreground operations. Foreground operations can include operations initiated by a host (e.g., host 102), such as read and/or write access commands. Background operations can include operations which are initiated by a controller (e.g., 108) and/or whose execution can be transparent to the host (e.g., host 102), such as neighbor disturb mitigation operations performed in accordance with embodiments of the present disclosure.

The memory components 110 can include a number of arrays of memory cells. The memory components 110 can include two-dimensional (2D) and/or three-dimensional (3D) array structures, such as cross point array structures. The memory cells can be resistance variable memory cells. The memory cells can include, for example, various types of resistance variable storage elements and/or switch elements. For example, the cells can be phase change random access memory (PCRAM) cells or resistive random access memory (RRAM) cells.

As used herein, a storage element refers to a programmable portion of a memory cell. For instance, the memory components 110 can be 3D cross point devices whose cells can include a "stack" structure in which a storage element is coupled in series with a switch element and which can be referred to herein as a 3D phase change material and switch (PCMS) device. 3D PCMS cells can include, for example, a two-terminal chalcogenide-based storage element coupled in series with a two-terminal chalcogenide based switch element, such as an ovonic threshold switch (OTS). In a number of embodiments, the memory cells can be self-selecting memory (SSM) cells in which a single material can serve as both the storage element and the memory element. An SSM cell can include a chalcogenide alloy; however, embodiments are not so limited.

As non-limiting examples, the memory cells of memory components 110 can include a phase change material (e.g., phase change chalcogenide alloy) such as an indium(In)-antimony(Sb)-tellurium(Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other memory cell materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

As shown in FIG. 1, the controller 108 includes a processing device 109 and a memory management component 111 configured to perform various memory management operations, in accordance with embodiments described herein. In this example, the memory management component 111 includes a neighbor disturb management component 113, a drift management component 117, and an error detection/correction component 115 (e.g., an error correction code (ECC) engine). The memory management component 111 also includes a number of data structures 114. As used herein, a "data structure" refers to a format for organizing and/or storing data, examples of which include tables, arrays, files, lists records, queues, trees, etc. As described further below, the data structures 114 can include a logical to physical (L2P) address mapping data structure (e.g., table) for mapping logical managed unit addresses (MUAs) addresses to physical managed units (PMUs) stored in memory 110 and a drift table. In some examples, the data structures 114 can include look-up tables for determining disturb increments for incrementing disturb counts corresponding to memory cells neighboring a memory cell being written in place as function of times between writes to place to the memory cell. It is noted that the terms "table" and "list" used to describe the particular data structures 114 are intended only as non-limiting examples.

The various components 113, 114, 115, and 117 of memory management component 111 can be discrete components, such as application specific integrated circuit (ASICs), or the components may reflect functionally provided by circuitry within the controller 108 that does not necessarily have a discrete physical form separate from other portions of the controller 108. Although illustrated as components within the memory management component 111 in FIG. 1, each of the components 113, 114, 115, and 117, or portions thereof, can be external to the memory management component 111 and/or external to the controller 108. For example, the error detection/correction component 115 can include a number of error correction coding circuits located on the controller 108 and a number of error correction coding circuits located external to the controller 108.

Figure 2:
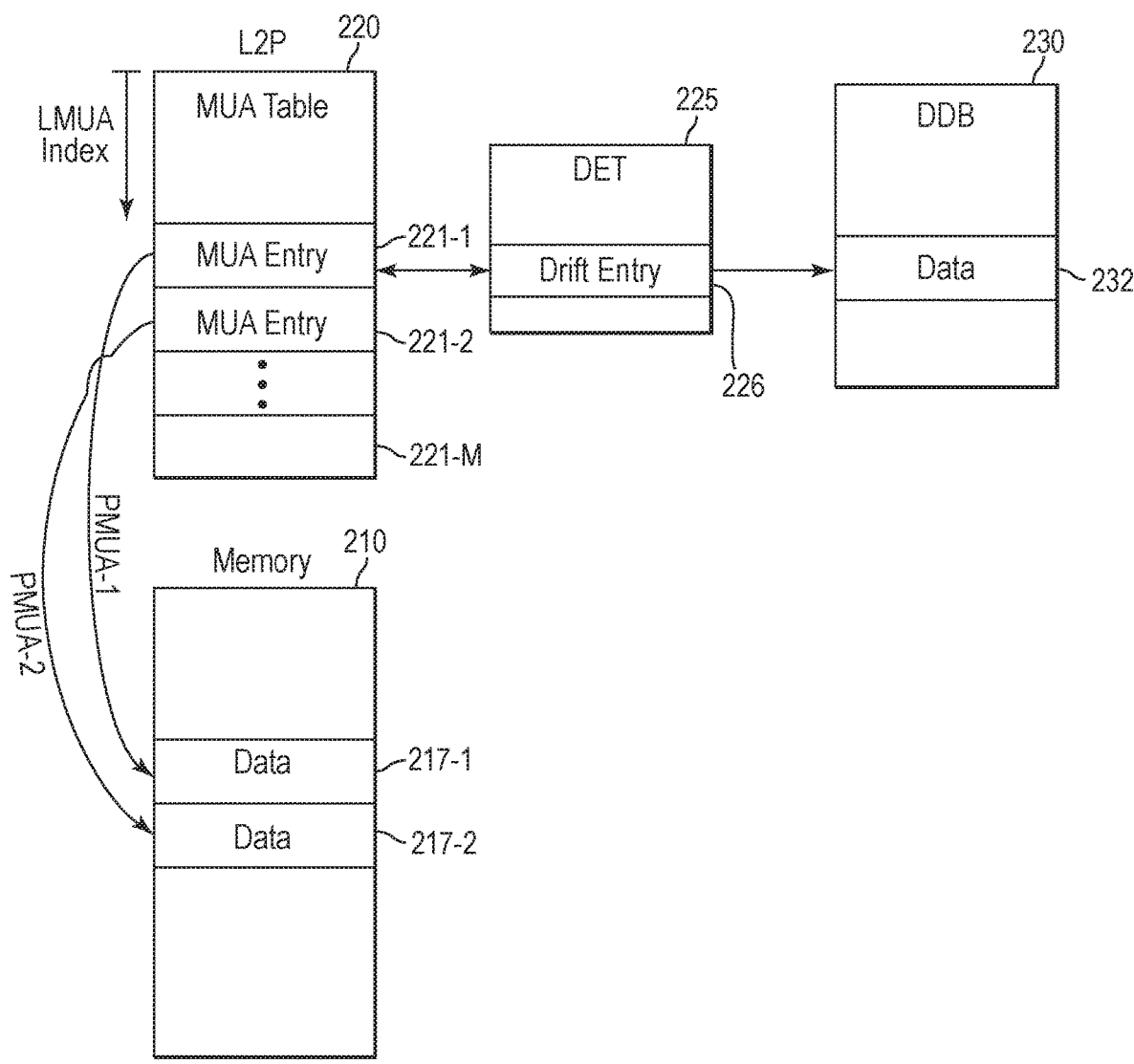
FIG. 2 illustrates an example of components associated with managing neighbor disturb in accordance with a number of embodiments of the present disclosure.

FIG. 2 illustrates an example of the components associated with managing neighbor disturb, such as thermal write disturb, in accordance with a number of embodiments of the present disclosure. In FIG. 2, a management unit address (MUA) table 220 represents a logical address to physical address (L2P) data structure associated with mapping a physical memory 210. The table 220 can be one of the data structures 114 maintained by a controller, such as controller 108, and the memory 210 can represent a memory, such as memory 110 shown in FIG. 1.

In operation, a host (e.g., host 102) can use logical addressing (e.g., logical block addressing) for identifying logical regions (e.g., sectors) of data. As an example, a logical address can correspond to 256 bytes, 512 bytes, 1,024 bytes, etc. The logical addresses (e.g., logical block addresses (LBAs)) can be organized by a controller (e.g., controller 108) into managed units (MUs), which can refer to a unit (e.g., size) of memory managed by the controller (e.g., via an L2P table). As an example, a logical MUA (LMUA) can correspond to multiple host LBAs such that a MU can correspond to 2 KB, 4 KB, 8 KB, etc. The size of a MU can also correlate to a write and/or read size associated with the memory being mapped (e.g., memory 210). A MU can, for example, correspond a number of memory cells, such as a group of resistance variable memory cells (e.g., a physical MU (PMU)). For example, the MU size can be a multiple of a physical page size of the memory, a multiple of a codeword size associated with the memory, etc.

As shown in FIG. 2, the MUA entries 221-1 to 221-M of table 220 can be indexed by LMUAs, with each entry including a physical managed unit address (PMUA) that indicates (e.g., points to) the location of a corresponding PMU in memory 210. For example, as shown in FIG. 2, a PMUA-1 in MUA entry 221-1 points to a PMU 217-1, and a PMUA-2 in MUA entry 221-2 points to a PMU 217-2. In a number of embodiments, the data stored in the group of cells corresponding to a PMU 217 can include user data and/or parity data as well as various metadata, which can include the LMUA currently mapping to the PMUA corresponding to the PMU 217.

FIG. 2 also illustrates an example of a drift entry table (DET) 225 that can be a data structure 114. DET 225 can include a drift entry 226 that can be referenced (e.g., pointed to) by a drift entry index in an MUA entry, such as MUA entry 221-1, while a number of memory cells in the PMU (e.g., PMU 217-1) corresponding to MUA entry 221-1 are in drift. In some examples, a drift tail can be the next drift entry in DET 225 to be retired from drift, and a drift head can be the next drift entry in DET 225 to be written.

When resistance variable cells are written to (e.g., programmed), for example, their resistive state can change (e.g., drift) for a particular period of time (e.g., a drift time period) until a steady resistive state is reached. For example, data read during the drift time period can be unreliable.

FIG. 2 further illustrates an example of a drift data buffer (DDB) 230, such as a DRAM buffer. A location 232 in DDB 230 having an address specified in drift entry 226 can temporarily store data during the drift time period while a number of cells in PMU 217-1 storing the same data concurrently are in drift. For example, in response to a read command that specifies an LMUA corresponding to (e.g., that indexes) MUA entry 221-1, memory management component 108 can determine whether PMU 217-1 is in drift from reading a drift indicator in MUA entry 221-1.

In response to determining that PMU 217-1 is in drift, memory management component 111 can activate drift management component 117 to perform a drift management operation. For example, drift management component 117 can read drift entry 226 in response to reading the drift entry index in MUA entry 221-1 that references drift entry 226. Drift management component 117 can then read the data from location 232 in response to reading the address of location 232 from drift entry 226.

Data can be read from DDB 230 instead of PMU 217-1 as long as PMU 217-1 is determined to be in drift. After a particular time period corresponding to the drift period, memory management component 111 can set the drift indicator to indicate that PMU 217-1 is not in drift. Memory management component 111 can then read the data from PMU 217-1 in response to determining that PMU 217-1 is not in drift from reading the drift indicator.

Figure 3:
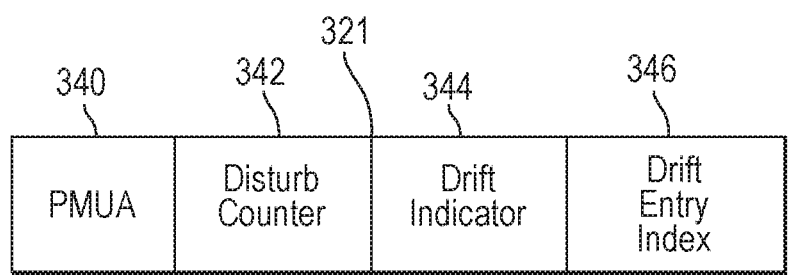
FIG. 3 illustrates an example of an entry of a memory management unit address data structure configured for disturb management in accordance with a number of embodiments of the present disclosure.

FIG. 3 illustrates an example of an MUA entry 321 that can be an MUA entry 221 and configured for disturb management, in accordance with a number of embodiments of the present disclosure. MUA entry 321 includes a field 340 that can store a PMUA that can address a PMU 217, for example. MUA entry 321 includes a disturb counter field 342, a drift indicator field 344 that can store a drift indicator, such as a flag, and a drift entry index field 346 that can store a drift entry index that can reference (e.g., point to) a drift entry in DET 225, such as drift entry 226.

Figure 4:
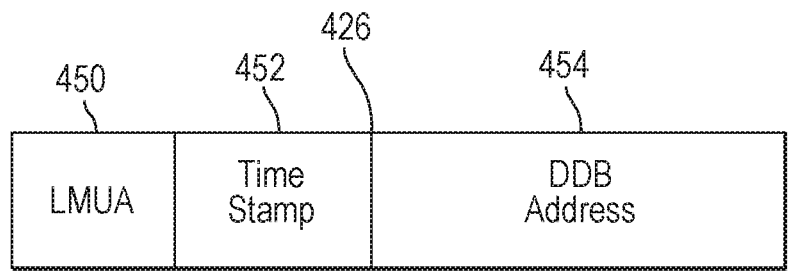
FIG. 4 illustrates an example of an entry of a drift entry data structure configured for disturb management in accordance with a number of embodiments of the present disclosure.

FIG. 4 illustrates an example of a drift entry 426 that can be drift entry 226 and configured for disturb management, in accordance with a number of embodiments of the present disclosure. Drift entry 426 can include an LMUA field 450 that can store an LMUA that can refer back to the MUA entry, such as MUA entry 221-1, whose drift entry index references drift entry 426. For example, the drift entry index in field 346 can reference drift entry 426, and the LMUA in field 450 can be the LMUA of MUA entry 321. Drift entry 426 includes a timestamp field 452 that can store a timestamp than can be the time a number of memory cells in the PMU 217 corresponding to the LMUA in field 450 was last written. For example, the LMUA can correspond to MUA entry 221-1 that corresponds to PMU 217-1, and the timestamp can be the last time memory cells in PMU 217-1 were written. Drift entry 426 can include a DDB address field 454 that can store a DDB address of a location in DDB 230.

In the example in which the LMUA in field 450 corresponds to MUA entry 221-1, if the timestamp is greater than a threshold drift time, meaning memory cells in PMU 217-1 are no longer in drift, drift management component 117 can retire the drift entry, such as drift entry 426, referenced by MUA entry 221-1. For example, if the drift indicator in MUA entry 221-1 points to a drift tail (e.g., drift entry 426 is a drift tail), then drift entry 426 is active and is retired, and the drift tail is incremented to the next drift entry, thereby freeing drift entry 426 and the location in DDB 230 having the DDB address in field 454 for a further write. For example, drift management component 117 can set the drift indicator in MUA entry 221-1 to indicate that PMU 217-1 is not in drift in response to retiring drift entry 426. If the drift indicator in MUA entry 221-1 does not point to a drift tail (e.g., drift entry 426 is not a drift tail), then drift entry 426 is inactive (e.g., stale) and the drift indicator in MUA entry 221-1 is left unchanged.

In some examples, a number of memory cells in PMU 217-2 can be neighbors to a number of memory cells in PMU 217-1. For example, the memory cells in PMU 217-2 can be write disturbed by writes in place to the memory cells PMU 217-1. The amount by which the memory cells in PMU 217-2 are disturbed can depend on the frequency of the writes to the memory cells in PMU 217-1. For example, the higher the frequency of the writes, the greater the disturb. For instance, the smaller the time interval between the writes, the higher the frequency and the greater the disturb. In some examples, a count increment by which the a disturb count corresponding to the memory cells in PMU 217-2 can be incremented can be based on the time interval between (e.g., the frequency of) consecutive writes to the memory cells of PMU 217-1. In examples in which MUA 321 is MUA 221-2, the disturb count of the disturb counter in field 342 can be incremented by a count increment, such as a disturb count increment, based on the time interval between the writes to the memory cells of PMU 217-1.

Figure 5:
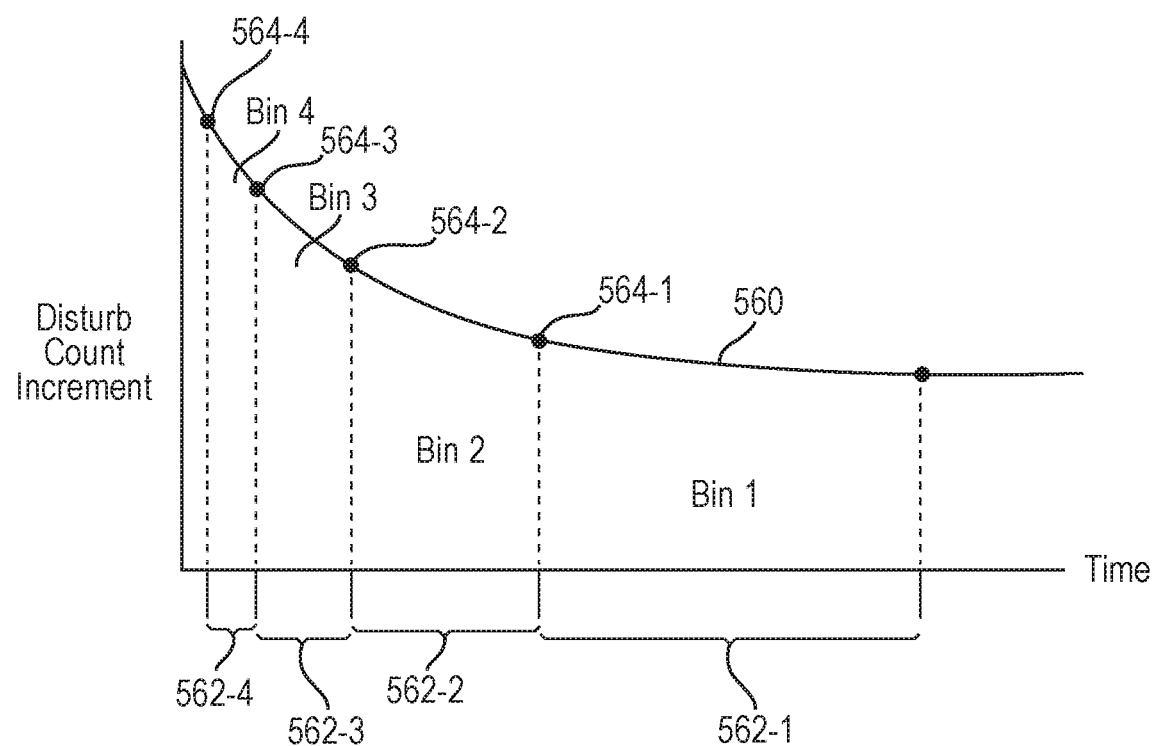
FIG. 5 is an example of a curve illustrating the relationship between write disturb and the time since a last write to a particular location in accordance with a number of embodiments of the present disclosure.

FIG. 5 is an example of a curve illustrating the relationship between write disturb and the time since a last write to a particular location in accordance with a number of embodiments of the present disclosure. For example, curve 560 illustrates a relationship between the amounts (e.g., disturb count increments) by which to increment a disturb count corresponding to a memory cell, such as a number memory cells in a PMU (e.g., PMU 221-2), and the consecutive write time intervals, such as the time between consecutive writes in place to a neighboring memory cell, such as in a neighbor PMU (e.g., PMU 221-1). In some examples, curve 560 can correspond to an exponential decay function. However, the present disclosure is not so limited, and the disturb count increment versus the time between writes can be a linear relationship among other functional relationships. In some examples, the disturb count increment can be tabulated as a function of (e.g., indexed by) the consecutive write time intervals in a look-up table that can be a data structure 114. As shown in FIG. 5, the disturb count increment decreases with increasing consecutive write time intervals (e.g., decreasing write frequencies). In some examples, a consecutive write time interval can be the time difference between the time a memory cell is last written, such as the timestamp in field 452, and the current time at which the memory cells is currently being written.

The consecutive write time intervals can be divided into ranges of consecutive write time intervals that can be referred to as bins. In FIG. 5, for example, the ranges of consecutive write time intervals 562-1 to 562-4 can respectively referred to as bin 1 to bin 4. The respective disturb count increments corresponding to the consecutive write time intervals at the beginning (e.g., the lowermost consecutive write time intervals) of the respective ranges can be the respective disturb count increments for the respective ranges. For example, the discrete disturb count increments respectively corresponding to data symbols 564-1 to 564-4 can be respectively for ranges 562-1 to 562-4. In some examples, the disturb counts increments, such as at the beginning of the ranges (e.g., at the lowermost consecutive write time intervals of the ranges), can be tabulated as a function of the ranges in a look-up table that can be a data structure 114. In an example, if the determined time between writes lies in a particular range, such as range 562-3, the disturb count increment is the disturb count increment for that range, such as the disturb count corresponding to data point 564-3.

A memory array that can be in a memory 110 can be a 3D cross point memory array that can include a number of stacks of planes of memory cells, such as the resistance variable cells previously described. In each plane, groups of memory cells, that can be referred to as rows of memory cells, can be commonly coupled to access lines that can be referred to as word lines. Each plane can also include groups of memory cells that can be referred to as columns of memory cells that can be commonly coupled to access lines that can be referred to as data lines (e.g., bit lines) that can be coupled to sense amplifiers. For example, the columns can cross (e.g., intersect) the rows.

In some examples, neighboring cells that are neighbors to an aggressor cell can be direct neighbors that are immediately adjacent to the aggressor cell without any intervening cells. For example, an aggressor cell can have direct neighbors within the same plane or in different planes.

The amount of disturb to neighboring cells can depend on their spatial relationship to the aggressor cell. For example, the disturb to neighbor cells can depend upon the direction from the aggressor cell. For example, disturb to a neighbor cell along a bit line can be greater than the disturb to a neighbor cell along a word line. Therefore, for the same time between writes, the disturb count increment can be greater for a neighbor cell along a bit line than for a neighbor cell along a word line. As such, there can be different functional relationships between the disturb count increment and time between writes for different spatial relationships. For example, there can be a different look-up table of disturb count increments versus times between writes for each spatial relationship. Disturb management component 113 can determine the disturb count increment by selecting the functional relationship (e.g., look-up table) for the particular spatial relationship and then determine the disturb count increment from the time between writes by the selected functional relationship.

Figure 6:
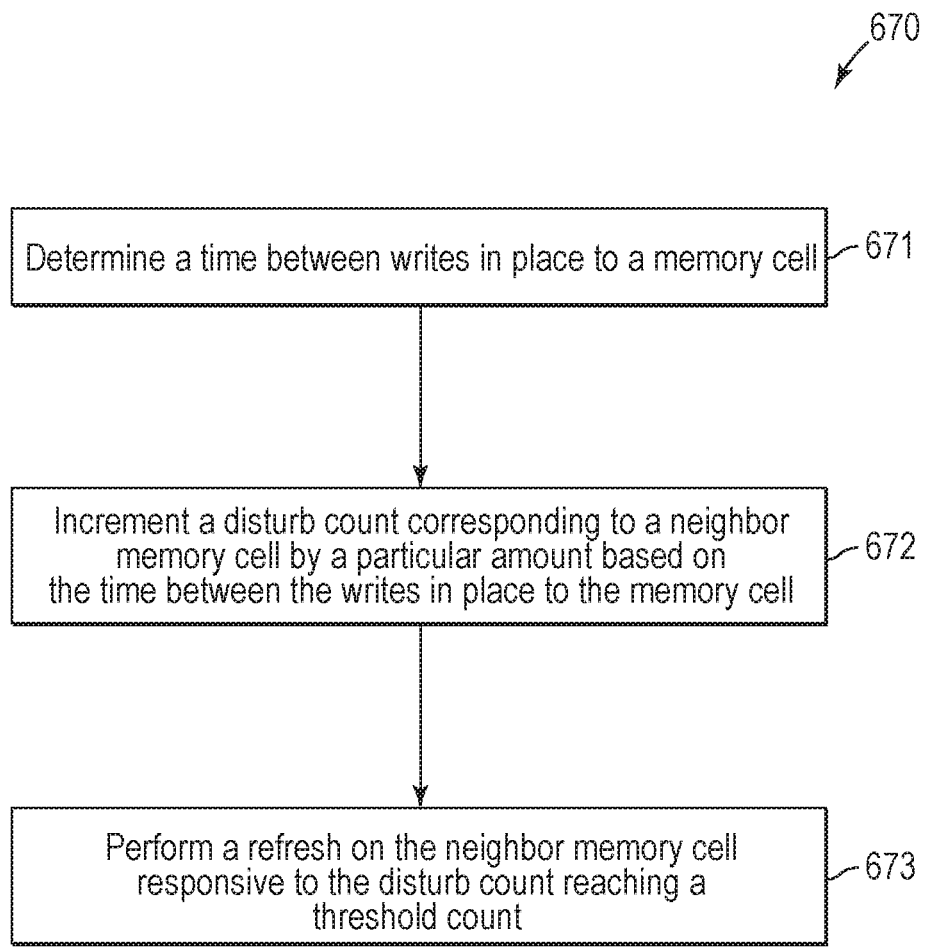
FIG. 6 is flowchart of an example of a method for disturb management in accordance with a number of embodiments of the present disclosure.

FIG. 6 is flowchart of an example of a method 670 for disturb management, in accordance with a number of embodiments of the present disclosure. For example, method 670 can be performed by disturb management component 113.

At block 671, a time between writes to a memory cell is determined. For example, the time between writes can be the difference between the current time at which the memory cell is currently being written and the time at which memory cell was last written. For example, the time at which the memory cell was last written can be the timestamp in the drift entry referenced by the MUA entry corresponding to the PMU that includes the memory cell. The timestamp can be read to determine the time at which the memory cell was last written. The timestamp can be updated to the current time after it is read.

In some examples, when a write occurs to a memory cell that is already in drift, the current DET entry in DET 225 that is referenced by the MUA entry corresponding to the PMU that includes the memory cell can be read to determine the time at which the memory cell was last written. The timestamp can be updated to the current time after it is read by writing the updated timestamp in a new DET entry in DET 225, for example. The current DET entry can then be invalidated, and the MUA entry corresponding to the PMU that includes the memory cell can be updated to reference new DET entry.

At block 672, a disturb count corresponding to a neighbor memory cell can be incremented by a particular amount that is based on the time between the writes. The disturb count increment can be determined from a relationship between the particular amount and the time between writes, such as from the relationship in FIG. 5. For example, the particular amount can be the disturb count increment, such as the disturb count increment corresponding to data point 564-3, corresponding to the range of consecutive write time intervals, such as range 562-3, that includes the determined time between writes. At block 673, a refresh operation is performed on the neighbor cell responsive to the disturb count reaching a threshold count.

Figure 7:
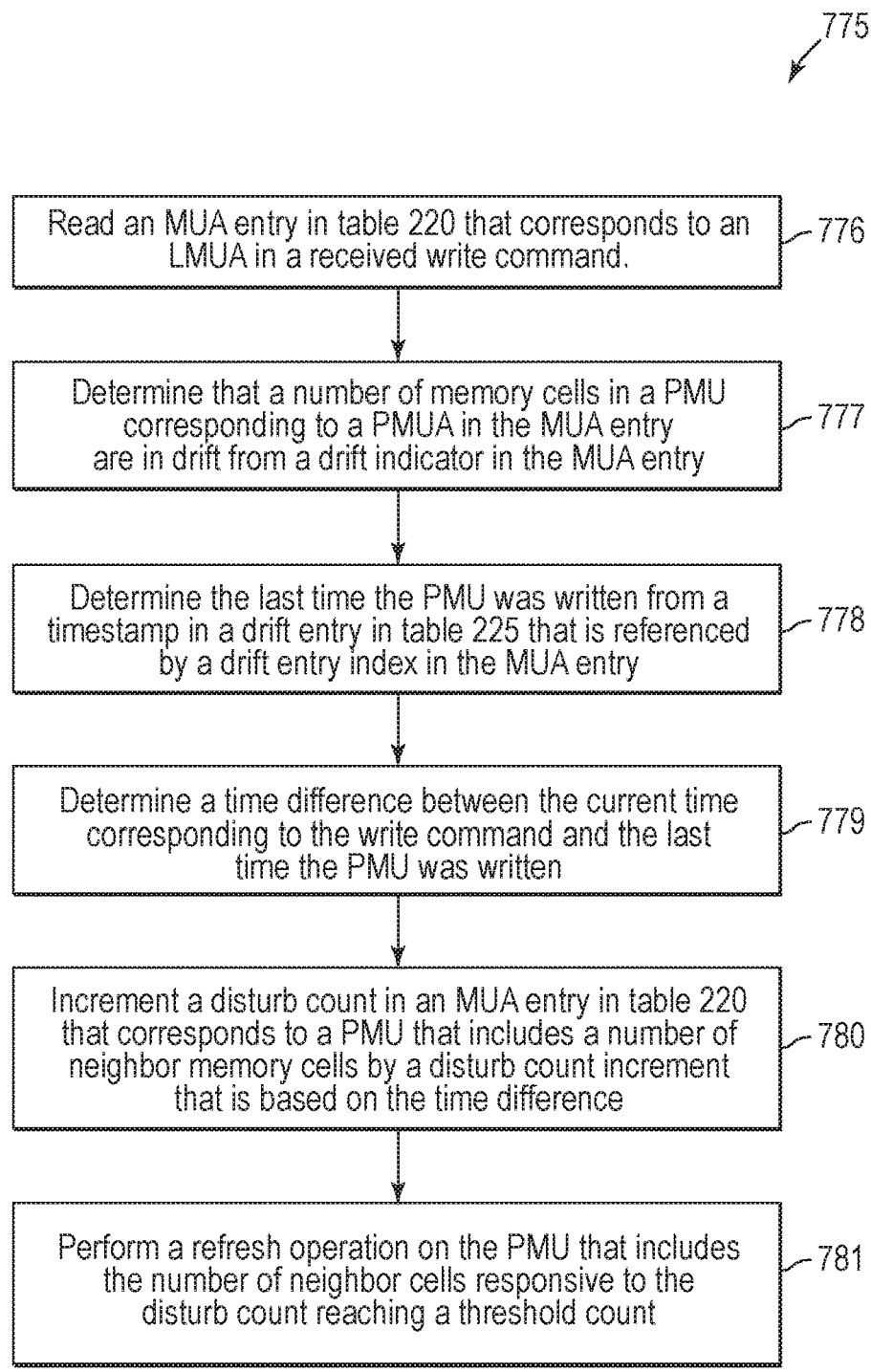
FIG. 7 is flowchart of an example of a method that can include write disturb management and drift management in accordance with a number of embodiments of the present disclosure.

FIG. 7 is flowchart of an example of a method 775 that can include write disturb management and drift management, in accordance with a number of embodiments of the present disclosure. For example, method 775 can be performed, at least in part by disturb management component 113 and drift management component 117.

An MUA entry, such as MUA entry 221-1, in table 220 that corresponds to an LMUA in a received write command is read at block 776. At block 777, a number of memory cells in a PMU, such as PMU 217-1, corresponding to a PMUA in the MUA entry, such as PMUA-1, are determined to be in drift from the drift indicator in the MUA entry. At block 778, the last time the PMU was written is determined from a timestamp in a drift entry, such as drift entry 226, in table 225 that is referenced by a drift entry index in the MUA entry. For example, the timestamp can be read in response to determining that the memory cells in the PMU are in drift.

At block 779, a time difference between the current time associated with the write command and the last time the PMU was written is determined. For example, the time difference can be the consecutive write time interval for, such as the time between consecutive writes to, a number of cells in the PMU and can represent the frequency of writes to the PMU.

At block 780, a disturb count in an MUA entry in table 220 that corresponds to a PMU, such as PMU 217-2, that includes a number of neighbor memory cells is incremented by a disturb count increment that is based on the time difference, such as by disturb management component 113 as a part of disturb management. For example, the neighbor memory cells in PMU 217-2 can be neighbors to the memory cells in PMU 217-1. In some examples, after the disturb count is incremented, the drift entry index in MUA entry 221-1 can be set (e.g., cleared) to indicate that the drift entry is inactive, such as by drift manager 117. In addition, the drift indicator can be set to indicate that the memory cells in PMU 217-1 are not in drift.

The disturb count increment can be determined by a functional relationship between disturb count increments and the consecutive write time interval, as discussed previously. For example, the disturb count increment can correspond to a range of the consecutive write time intervals that includes the consecutive write time interval. In some examples, the functional relationship can be selected based upon a spatial relationship between the memory cells in PMU 217-1 and in PMU 217-2. At block 781, a refresh operation is performed on the PMU includes the number of neighbor memory cells responsive to the disturb count reaching a threshold count. In some examples, the disturb count corresponding to the PMU includes the number of neighbor memory cells can be reset in response to performing the refresh operation.

In some examples, data in the write command written is to the PMU corresponding to the PMUA in the MUA entry corresponding to the LMUA and to an entry in DDB 230 concurrently. For example, the data can be written after the drift entry index in MUA entry 221-1 is set (e.g., cleared) to indicate that the drift entry is inactive and after the drift indicator in MUA entry 221-1 is set to indicate no drift.

The drift indicator MUA entry 221-1 can be set to indicate that cells in PMU 217-1 are in drift and the drift entry index in MUA entry 221-1 can be set to refer to the next drift entry (e.g., after drift entry 226). The timestamp field in that drift entry can be set to the current time. The DDB address in that drift entry can then be set to a location in DDB 230, and the data in the write command can be written to PMU 217-1 and to the location in DDB 230 having the DDB address concurrently.

Figure 8:
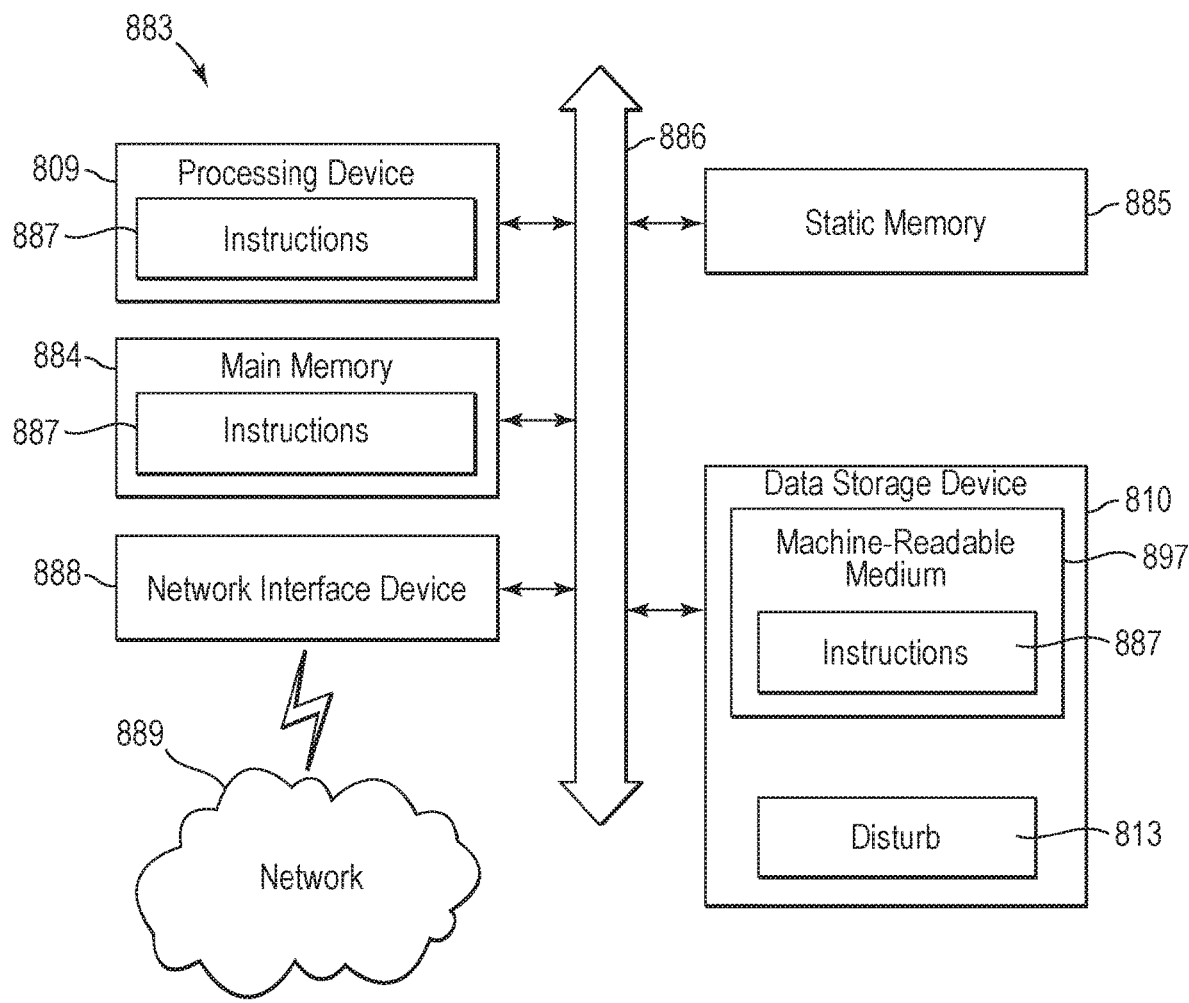
FIG. 8 is a block diagram of an example apparatus in the form of a computer system in which implementations of the present disclosure may operate in accordance with a number of embodiments of the present disclosure.

FIG. 8 is a block diagram of an example apparatus in the form of a computer system 883 in which implementations of the present disclosure may operate. For example, the computer system 883 may include or utilize a memory system, such as memory system 104 of FIG. 1 (e.g., an SSD, eMMC device, UFS). System 883 can also be a system, such as computing system 100 shown in FIG. 1. The system 883 can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 883 includes a processing device 809, a main memory 884 (e.g., read-only memory (ROM), flash memory, dynamic random access memory (DRAM), such as synchronous DRAM (SDRAM) or Rambus DRAM (RDRAM), etc.), a static memory 885 (e.g., flash memory, static random access memory (SRAM), etc.), and a data storage device 810, which communicate with each other via a bus 886.

Processing device 809 represents one or more general-purpose processing devices, such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 809 can also be one or more special-purpose processing devices, such as an application specific integrated circuit (ASIC), a field programmable gate array (FPGA), a digital signal processor (DSP), network processor, or the like. The processing device 809 is configured to execute instructions 887 for performing the operations and steps discussed herein. The computer system 883 can further include a network interface device 888 to communicate over the network 889.

Data storage device 810 can include a disturb management component 813 that can be similar to (e.g., the same as) disturb management component 113. Data storage device 810 can include a machine-readable storage medium 897 (also referred to as a computer-readable medium) on which is stored one or more sets of instructions 887 (e.g., software) embodying one or more of the various methodologies or functions described herein. The instructions 887 can also reside, completely or at least partially, within the main memory 884 and/or within the processing device 808 during execution thereof by the computer system 883, the main memory 884 and the processing device 808 also constituting machine-readable storage media. The machine-readable storage medium 897, data storage device 810, and/or main memory 884 can correspond to the memory system 104 of FIG. 1.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that can include a machine-readable medium having stored thereon instructions, which may be used to program a computer system (or other electronic devices) to perform a process according to the present disclosure.

As used herein, "a" or "an" can refer to one or more of something, and "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Various methods of the present disclosure, such as the methods described in FIG. 6 and FIG. 7, can be performed by processing logic in the form of hardware (e.g., a processing device such as a processor, control circuitry, dedicated logic, programmable logic, integrated circuits, etc.) and/or software (e.g., instructions, which can include firmware, and which can be executed by a processing device), and/or or a combination thereof.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for disturb management, comprising:
   determining a time between writes in place to a memory cell;
   incrementing a disturb count corresponding to a neighbor memory cell by a particular amount based on the time between the writes in place to the memory cell; and
   responsive to the disturb count reaching a threshold count, performing a refresh operation on the neighbor cell.

2. The method of claim 1, further comprising incrementing the disturb count corresponding to the neighbor cell by different particular amounts depending upon the time between writes to the memory cell.

3. The method of claim 2, further comprising:
   incrementing the disturb count corresponding to the memory cell by a first particular amount responsive to the time between the writes in place to the memory cell being a first value; and
   incrementing the disturb count corresponding to the memory cell by a second particular amount responsive to the time between the writes in place to the memory cell being a second value;
   wherein the first particular amount is greater than the second particular amount responsive to the first value being less than the second value, and wherein the first particular amount is less than the second particular amount responsive to the first value being greater than the second value.

4. The method of claim 2, wherein performing the refresh operation on the neighbor cell comprises reading a data value from the neighbor cell and rewriting the data value read from the neighbor cell back to neighbor memory cell.

5. The method of claim 2, further comprising resetting the disturb count corresponding to the neighbor cell in response to performing the refresh operation.

6. The method of claim 1, further comprising determining the particular amount by accessing a data structure indexed by consecutive write time intervals, the consecutive write time intervals corresponding to different respective disturb count increment amounts.

7. The method of claim 6, wherein the respective disturb count increment amounts decrease as the corresponding consecutive write time intervals increase, and wherein the method includes selecting the particular disturb count increment amount based on in which of the consecutive write time intervals the time between the writes in place to the memory cell falls.

8. The method of claim 1, wherein incrementing the disturb count corresponding to the neighbor memory cell by the particular amount based on the time between the writes in place to the memory cell further comprises determining the particular amount based on a spatial relationship between the memory cell and the neighbor memory cell.

9. The method of claim 1, wherein the method includes determining whether the memory cell is currently in drift.

10. The method of claim 9, further comprising determining whether the memory cell is currently in drift by accessing a data structure comprising entries corresponding to physical addresses of managed units currently in drift.

11. The method of claim 1, wherein incrementing the disturb count corresponding to the neighbor memory cell by the particular amount comprises incrementing a disturb count in a disturb count field in an entry of a data structure that comprises a physical address for a physical managed unit corresponding to the neighbor memory cell.

12. A system, comprising:
a memory component comprising a number of physical managed units;
a processing device coupled to the memory component and configured to:
responsive to a received write command to a particular physical managed unit, determine an amount of time since the particular physical managed unit was last written;
increment a disturb count corresponding to a neighbor physical managed unit by a particular amount based on the determined amount of time; and
responsive to the disturb count reaching a threshold count, performing a refresh operation on the neighbor physical managed unit.

13. The system of claim 12, wherein the processing device is configured to:
determine the amount of time since the particular physical managed unit was last written based on a difference between a current time and a time the particular physical managed unit was last written; and
determine whether the particular physical managed unit is in drift based on the difference between the current time and the time the particular physical managed unit was last written.

14. The system of claim 12, wherein the system comprises a memory management component configured to maintain a data structure whose entries correspond to respective physical managed units, wherein each entry comprises:
a physical address corresponding to a respective physical managed unit; and
a drift indicator corresponding to the respective physical managed unit; and
wherein the processing device is configured to determine whether the particular physical managed unit is currently in drift based on the drift indicator.

15. The system of claim 14, wherein each entry of the data structure comprises a respective disturb count field, and wherein the processing device is configured to increment the disturb count corresponding to the neighbor physical managed unit by the particular amount.

16. The system of claim 14, wherein:
the data structure is a first data structure;
the memory management component is configured to maintain a second data structure whose entries are referenced by indices in respective entries in the first data structure;
the processing device is configured to determine the time at which the particular physical managed unit was last written from a timestamp in an entry in the second data structure referenced by the index in the respective entry in the first data structure corresponding to the particular physical managed unit; and
the entry in the second data structure is referenced by the index in the respective entry in the first data structure only while the corresponding drift indicator in the respective entry in the first data structure indicates that the particular physical managed unit is in drift.

17. The system of claim 16, wherein the processing device is configured to write data to the particular physical managed unit and to a location in a buffer specified in the entry in the second data structure.

18. An apparatus, comprising:
a memory component;
a controller coupled to the memory component and configured to:
determine a time between consecutive writes in place to a memory cell in the memory component;
increment a disturb count corresponding to a neighbor memory cell in the memory component by a particular amount based on the time between the consecutive writes in place to the memory cell; and
responsive to the disturb count reaching a threshold count, perform a refresh operation on the neighbor cell.

19. The apparatus of claim 18, wherein:
respective ranges of consecutive write time intervals correspond to respective count increments; and
the controller is configured to determine the particular amount from the respective count increment corresponding to a range that comprises a consecutive write time interval corresponding to the determined time between consecutive writes.

20. The apparatus of claim 18, wherein the particular amount is further based on a spatial relationship between the memory cell and the neighbor memory cell.

* * * * *